United States Patent
Shi et al.

(10) Patent No.: US 12,236,831 B2
(45) Date of Patent: Feb. 25, 2025

(54) PIXEL DRIVING CIRCUIT AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Kunyan Shi, Beijing (CN); Yafei Chen, Beijing (CN); Gang Wang, Beijing (CN); Qiang Fu, Beijing (CN); Erlong Song, Beijing (CN); Kai Zhang, Beijing (CN); Peng Xu, Beijing (CN); Xingrui Cai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/278,706

(22) PCT Filed: Jul. 1, 2022

(86) PCT No.: PCT/CN2022/103292
§ 371 (c)(1),
(2) Date: Aug. 24, 2023

(87) PCT Pub. No.: WO2023/005597
PCT Pub. Date: Feb. 2, 2023

(65) Prior Publication Data
US 2024/0135885 A1 Apr. 25, 2024
US 2024/0233599 A9 Jul. 11, 2024

(30) Foreign Application Priority Data

Jul. 30, 2021 (WO) ............... PCT/CN2021/109894
Aug. 5, 2021 (CN) .......................... 202110898740.1

(51) Int. Cl.
G09G 3/20 (2006.01)
G09G 3/3225 (2016.01)
(Continued)

(52) U.S. Cl.
CPC ......... G09G 3/2007 (2013.01); G09G 3/3225 (2013.01); G09G 3/3233 (2013.01);
(Continued)

(58) Field of Classification Search
CPC .. G09G 3/2007; G09G 3/3258; G09G 3/3225; G09G 3/3233; G09G 2300/0408;
(Continued)

(56) References Cited

U.S. PATENT DOCUMENTS 9,691,348 B2 6/2017 Kim et al.
11,217,175 B2 1/2022 Teng et al.
(Continued)

FOREIGN PATENT DOCUMENTS

CN 1435805 A 8/2003
CN 102654975 A 9/2012
(Continued)

OTHER PUBLICATIONS

International Search Report issued on Mar. 28, 2022, for application No. PCT/CN2021/117473 with English translation attached.
(Continued)

Primary Examiner — Jimmy H Nguyen
(74) Attorney, Agent, or Firm — Nath, Goldberg & Meyer; Joshua B. Goldberg

(57) ABSTRACT

The present disclosure provides a pixel driving circuit and a display panel. The pixel drive circuit includes: a data writing sub-circuit, a threshold compensation sub-circuit, a driving sub-circuit and a storage sub-circuit, the data writing sub-circuit includes a fourth transistor, which includes a first electrode connected with a data line, a second electrode
(Continued)

connected with a first terminal of the driving sub-circuit, and a control electrode connected with a first scan signal line, and the fourth transistor is an oxide thin film transistor; the threshold compensation sub-circuit is configured to compensate a threshold voltage of the driving sub-circuit in response to a second scan signal; the storage sub-circuit is configured to store a data voltage signal; the driving sub-circuit is configured to provide a driving current for a light emitting device to be driven according to voltages of the first terminal and a control terminal thereof.

18 Claims, 9 Drawing Sheets

(51) Int. Cl.
  *G09G 3/3233* (2016.01)
  *G09G 3/3258* (2016.01)
  *H10K 59/131* (2023.01)
(52) U.S. Cl.
  CPC ......... *G09G 3/3258* (2013.01); *H10K 59/131* (2023.02); *G09G 2300/0408* (2013.01); *G09G 2300/0426* (2013.01); *G09G 2300/0819* (2013.01); *G09G 2300/0842* (2013.01); *G09G 2300/0852* (2013.01); *G09G 2300/0861* (2013.01); *G09G 2310/0254* (2013.01); *G09G 2310/061* (2013.01); *G09G 2310/08* (2013.01); *G09G 2320/0233* (2013.01); *G09G 2320/0247* (2013.01); *G09G 2320/0252* (2013.01); *G09G 2320/0257* (2013.01); *G09G 2320/045* (2013.01); *G09G 2320/0626* (2013.01)
(58) Field of Classification Search
  CPC ... G09G 2300/0819; G09G 2300/0861; G09G 2300/0842; G09G 2300/0852; G09G 2300/0426; G09G 2310/0251; G09G 2310/0262; G09G 2310/061; G09G 2310/08; G09G 2310/0254; G09G 2320/045; G09G 2320/0257; G09G 2320/0233; G09G 2320/0247; G09G 2320/0252; G09G 2320/0626; H10K 59/131
  USPC .................................................... 345/76, 208
  See application file for complete search history.

(56) References Cited

U.S. PATENT DOCUMENTS

| | | |
|---|---|---|
| 2002/0089291 A1 | 7/2002 | Kaneko et al. |
| 2003/0142052 A1 | 7/2003 | Matsumoto |
| 2010/0141644 A1 | 6/2010 | Lee et al. |
| 2012/0147060 A1 | 6/2012 | Jeong |
| 2013/0127818 A1 | 5/2013 | Tsai et al. |
| 2015/0054812 A1 | 2/2015 | Jeon |
| 2015/0170576 A1 | 6/2015 | Bae |
| 2015/0348466 A1 | 12/2015 | Park et al. |
| 2015/0379930 A1 | 12/2015 | Lee et al. |
| 2016/0012775 A1 | 1/2016 | Jeong et al. |
| 2016/0078809 A1 | 3/2016 | Yoon et al. |
| 2017/0039939 A1 | 2/2017 | Chaji |
| 2017/0039940 A1 | 2/2017 | Han et al. |
| 2017/0162145 A1 | 6/2017 | Huang et al. |
| 2018/0040275 A1 | 2/2018 | Wu |
| 2018/0166021 A1 | 6/2018 | Xi et al. |
| 2018/0166025 A1 | 6/2018 | Zhou et al. |
| 2019/0057646 A1 | 2/2019 | Lin et al. |
| 2019/0096327 A1 | 3/2019 | Peng et al. |
| 2019/0213958 A1 | 7/2019 | Cho et al. |
| 2019/0221165 A1 | 7/2019 | Park et al. |
| 2019/0237019 A1 | 8/2019 | Gao et al. |
| 2019/0295473 A1 | 9/2019 | Lu et al. |
| 2021/0104196 A1 | 4/2021 | Yuan |
| 2021/0118361 A1 | 4/2021 | Li |
| 2021/0134224 A1 | 5/2021 | He et al. |
| 2021/0167161 A1 | 6/2021 | Yang et al. |
| 2021/0225282 A1* | 7/2021 | Cho .................... G09G 3/3233 |
| 2021/0407390 A1* | 12/2021 | Li ........................ G09G 3/3266 |
| 2022/0172681 A1 | 6/2022 | Kim et al. |
| 2022/0180811 A1 | 6/2022 | Kim et al. |
| 2023/0008643 A1 | 1/2023 | Park et al. |
| 2023/0133704 A1 | 5/2023 | Gai et al. |
| 2023/0360600 A1 | 11/2023 | Wang et al. |

FOREIGN PATENT DOCUMENTS

| | | |
|---|---|---|
| CN | 103855192 A | 6/2014 |
| CN | 104200771 A | 12/2014 |
| CN | 104485071 A | 4/2015 |
| CN | 106558287 A | 4/2017 |
| CN | 106910460 A | 6/2017 |
| CN | 107068060 A | 8/2017 |
| CN | 107256695 A | 10/2017 |
| CN | 107274830 A | 10/2017 |
| CN | 107358918 A | 11/2017 |
| CN | 107492351 A | 12/2017 |
| CN | 107507568 A | 12/2017 |
| CN | 107610651 A | 1/2018 |
| CN | 107665672 A | 2/2018 |
| CN | 107799062 A | 3/2018 |
| CN | 207082320 U | 3/2018 |
| CN | 108133687 A | 6/2018 |
| CN | 108320710 A | 7/2018 |
| CN | 108492775 A | 9/2018 |
| CN | 108538243 A | 9/2018 |
| CN | 108777127 A | 11/2018 |
| CN | 108831385 A | 11/2018 |
| CN | 108877655 A | 11/2018 |
| CN | 109102778 A | 12/2018 |
| CN | 109243369 A | 1/2019 |
| CN | 109285500 A | 1/2019 |
| CN | 109599062 A | 4/2019 |
| CN | 109801592 A | 5/2019 |
| CN | 109887464 A | 6/2019 |
| CN | 109935212 A | 6/2019 |
| CN | 109949743 A | 6/2019 |
| CN | 110010072 A | 7/2019 |
| CN | 110047428 A | 7/2019 |
| CN | 110047432 A | 7/2019 |
| CN | 110070826 A | 7/2019 |
| CN | 110223636 A | 9/2019 |
| CN | 111063301 A | 4/2020 |
| CN | 210348517 U | 4/2020 |
| CN | 111354307 A | 6/2020 |
| CN | 111383597 A | 7/2020 |
| CN | 111402810 A | 7/2020 |
| CN | 111435587 A | 7/2020 |
| CN | 111445848 A | 7/2020 |
| CN | 111445857 A | 7/2020 |
| CN | 211062442 U | 7/2020 |
| CN | 111489698 A | 8/2020 |
| CN | 111489701 A | 8/2020 |
| CN | 111613177 A | 9/2020 |
| CN | 111696484 A | 9/2020 |
| CN | 111710303 A | 9/2020 |
| CN | 111754921 A | 10/2020 |
| CN | 111968564 A | 11/2020 |
| CN | 111986622 A | 11/2020 |
| CN | 112102785 A | 12/2020 |
| CN | 112116890 A | 12/2020 |
| CN | 112133242 A | 12/2020 |
| CN | 112397028 A | 2/2021 |
| CN | 112599099 A | 4/2021 |
| CN | 112634832 A | 4/2021 |
| CN | 112735314 A | 4/2021 |
| CN | 112785958 A | 5/2021 |
| CN | 112802431 A | 5/2021 |
| CN | 112908246 A | 6/2021 |
| CN | 113140179 A | 7/2021 |

(56) References Cited

FOREIGN PATENT DOCUMENTS

| | | | |
|---|---|---|---|
| CN | 113160740 | A | 7/2021 |
| CN | 113851083 | A | 12/2021 |
| CN | 114222615 | A | 3/2022 |
| CN | 114258320 | A | 3/2022 |
| CN | 114514573 | A | 5/2022 |
| JP | 2000221903 | A | 8/2000 |
| JP | 2015132738 | A | 7/2015 |
| KR | 20120064493 | A | 6/2012 |
| KR | 20130026338 | A | 3/2013 |
| KR | 20130055450 | A | 5/2013 |
| KR | 20150064543 | A | 6/2015 |
| KR | 20150073420 | A | 7/2015 |
| WO | 2014153820 | A1 | 10/2014 |
| WO | 2019242557 | A1 | 12/2019 |
| WO | 2020124759 | A1 | 6/2020 |
| WO | 2020258421 | A1 | 12/2020 |
| WO | 2022061852 | A1 | 3/2022 |

OTHER PUBLICATIONS

International Search Report issued on Apr. 26, 2022, for application No. PCT/CN2021/109894 with English translation attached.
International Search Report issued on Sep. 6, 2022, for application No. PCT/CN2022/104654 with English translation attached.
International Search Report issued on Sep. 21, 2022, for application No. PCT/CN2022/105458 with English translation attached.
International Search Report issued on Sep. 28, 2022, for application No. PCT/CN2022/105457 with English translation attached.
First Office Action issued on Nov. 23, 2022, for application No. CN202180002066.2 with English translation attached.
Second Office Action issued on Feb. 17, 2023, for application No. CN202180002066.2 with English translation attached.
Third Office Action issued on May 10, 2023, for application No. CN202180002066.2 with English translation attached.
First Office Action issued on May 22, 2024 for U.S. Appl. No. 18/273,201.
First Office Action issued on Jul. 3, 2024 for U.S. Appl. No. 18/014,763.
First Office Action issued on Jul. 29, 2024 for U.S. Appl. No. 17/794,130.
United States Notice of Allowance dated Oct. 17, 2024 corresponding to U.S. Appl. No. 18/014,763.
Corrected United States Notice of Allowance dated Oct. 7, 2024 corresponding to U.S. Appl. No. 18/273,201.
United States Notice of Allowance dated Nov. 29, 2024 corresponding to U.S. Appl. No. 17/794,130.
United States Notice of Allowance dated Sep. 6, 2024 corresponding to U.S. Appl. No. 18/273,201.
United States First Office Action dated Oct. 25, 2024 corresponding to U.S. Appl. No. 18/548,974.
First Office Action dated Oct. 23, 2024 corresponding to Chinese application No. 202180002499.8.
First Office Action dated Nov. 15, 2024 corresponding to Chinese application No. 202110897722.1.
Requirement for restriction issued on Nov. 8, 2024, for U.S. Appl. No 18/548,184.
Second corrected Notice of allowance issued on Dec. 11, 2024, for U.S. Appl. No. 18/273,201.
First Office Action issued on Dec. 6, 2024, for application No. CN202110898740.1 with English translation attached.
First Office Action issued on Dec. 20, 2024, for application No. CN202110897625.2 with English translation attached.
First Office Action issued on Dec. 29, 2024, for application No. CN202110898582.X with English translation attached.

* cited by examiner

PIXEL DRIVING CIRCUIT AND DISPLAY PANEL

This is a National Phase Application filed under 35 U.S.C. 371 as a national stage of PCT/CN2022/103292, filed Jul. 1, 2022, an application claiming the benefit of International Application No. PCT/CN2021/109894, filed Jul. 30, 2021, and Chinese Application No. 202110898740.1, filed Aug. 5, 2021, the content of each of which is hereby incorporated by reference in its entirety.

TECHNICAL FIELD

The present disclosure relates to the field of display technology, and particularly relates to a pixel driving circuit and a display panel.

BACKGROUND

The application of Active Matrix Organic Light Emitting Diode (AMOLED) display panels is becoming more and more widespread. The pixel display device of the AMOLED display panel is an Organic Light-Emitting Diode (OLED), and the AMOLED can emit light by driving a thin film transistor to generate a driving current in a saturated state, and the driving current drives the OLED to emit Light.

SUMMARY

The present disclosure is directed to solve at least one of the technical problems in the related art, and provides a pixel driving circuit and a display panel.

In a first aspect, an embodiment of the present disclosure provides a pixel driving circuit, which includes: a data writing sub-circuit, a threshold compensation sub-circuit, a driving sub-circuit and a storage sub-circuit, where
  the data writing sub-circuit includes a fourth transistor, a first electrode of the fourth transistor is connected with a data line, a second electrode of the fourth transistor is connected with a first terminal of the driving sub-circuit, and a control electrode of the fourth transistor is connected with a first scan signal line, and the fourth transistor is an oxide thin film transistor;
  the threshold compensation sub-circuit is configured to compensate a threshold voltage of the driving sub-circuit in response to a second scan signal;
  the storage sub-circuit is configured to store a data voltage signal;
  the driving sub-circuit is configured to provide a driving current for a light emitting device to be driven according to voltages of the first terminal and a control terminal thereof.

In some implementations, the pixel driving circuit further includes: a first reset sub-circuit and a second reset sub-circuit, where
  the first reset sub-circuit is configured to reset, in response to a first reset signal, the voltage of the control terminal of the driving sub-circuit through a first initialization signal; and
  the second reset sub-circuit is configured to reset, in response to a second reset signal, a first electrode of the light emitting device to be driven through a second initialization signal.

In some implementations, the first reset sub-circuit includes a first transistor, and the second reset sub-circuit includes a seventh transistor;
  a first electrode of the first transistor is connected with a first initialization signal terminal, a second electrode of the first transistor is connected with the control terminal of the driving sub-circuit, and a control electrode of the first transistor is connected with a first reset signal terminal; and
  a first electrode of the seventh transistor is connected with the first electrode of the light emitting device to be driven, a second electrode of the seventh transistor is connected with a second initialization signal terminal, and a control electrode of the seventh transistor is connected with a second reset signal terminal.

In some implementations, the first transistor is an oxide thin film transistor.

In some implementations, the pixel driving circuit further includes: a first light emission control sub-circuit and a second light emission control sub-circuit, where
  the first light emission control sub-circuit is configured to control, in response to a first light emission control signal, whether a first voltage is written into the first terminal of the driving sub-circuit;
  the second light emission control sub-circuit is configured to electrically connect/disconnect, in response to a second light emission control signal, the driving sub-circuit with/from the light emitting device to be driven.

In some implementations, the first emission control sub-circuit includes: a fifth transistor, and the second emission control sub-circuit includes a sixth transistor,
  a first electrode of the fifth transistor is connected with a first power terminal, a second electrode of the fifth transistor is connected with the first terminal of the driving sub-circuit, and a control electrode of the fifth transistor is connected with a first enable signal terminal; and
  a first electrode of the sixth transistor is connected with a second terminal of the driving sub-circuit, a second electrode of the sixth transistor is connected with the first electrode of the light emitting device to be driven, and a control electrode of the sixth transistor is connected with a second enable signal terminal.

In some implementations, the pixel driving circuit further includes: a data voltage supply sub-circuit, where
  the data voltage supply sub-circuit is configured to write a first voltage into the data line in an initialization stage, so that the data writing sub-circuit transmits the first voltage to the first terminal of the driving sub-circuit; the first voltage is greater than or equal to a data voltage corresponding to a maximum brightness value that the light emitting device displays; or, the first voltage is greater than or equal to a data voltage corresponding to a minimum brightness value that the light emitting device displays.

In some implementations, the pixel driving circuit further includes: an auxiliary sub-circuit, where
  the auxiliary sub-circuit is configured to reduce a leakage current of the fourth transistor under control of a third scan signal.

In some implementations, the auxiliary sub-circuit includes an eighth transistor, where
  a first electrode of the eighth transistor is connected with the data line, a second electrode of the eighth transistor is connected with the first electrode of the fourth transistor, and a control electrode of the eighth transistor is connected with a third scan signal line.

In some implementations, the pixel driving circuit further includes: a first scan control sub-circuit and a second scan control sub-circuit, where the first scan control sub-circuit is configured to provide a first scan signal for the fourth transistor in a data writing and threshold compensation stage;

the second scan control sub-circuit is configured to provide the second scan signal to the threshold compensation sub-circuit in the data writing and threshold compensation stage; and a start timing of the first scan signal is earlier than that of the second scan signal; an ending timing of the first scan signal is the same as that of the second scan signal.

In some implementations, a duration of the first scan signal is 1.2 to 2.0 times a duration of the second scan signal.

In some implementations, the driving sub-circuit includes: a third transistor, where a first electrode of the third transistor is connected with the second electrode of the fourth transistor, a second electrode of the third transistor is connected with a second terminal of the threshold compensation sub-circuit, and a control electrode of the third transistor is connected with a first terminal of the threshold compensation sub-circuit.

In some implementations, the threshold compensation sub-circuit includes a second transistor, where a first electrode of the second transistor is connected with the control terminal of the driving sub-circuit, a second electrode of the second transistor is connected with the second terminal of the driving sub-circuit, and a control electrode of the second transistor is connected with a second scan signal line.

In some implementations, the second transistor is an oxide thin film transistor.

In some implementations, the storage sub-circuit includes a storage capacitor, where a first terminal of the storage capacitor is connected with a first power terminal, and a second terminal of the storage capacitor is connected with the control terminal of the driving sub-circuit.

In a second aspect, an embodiment of the present disclosure provides a display panel, which includes the pixel driving circuit described above.

DETAIL DESCRIPTION OF EMBODIMENTS

In order to make those skilled in the art better understand the technical solutions of the present disclosure, the present disclosure is further described below in detail with reference to the accompanying drawings and implementations.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprises/comprising" or "includes/including", and the like, means that the element or item preceding the word includes the element or item listed after the word and its equivalent, but does not exclude other elements or items. The terms "connected/connecting" or "coupled/coupling" and the like are not restricted to physical or mechanical connections, but may include electrical connections, whether direct or indirect. Terms "Upper/on", "lower/under", "left", "right", and the like are used only to indicate relative positional relationships, and when the absolute position of the object being described is changed, the relative positional relationships may be changed accordingly.

Figure 1:
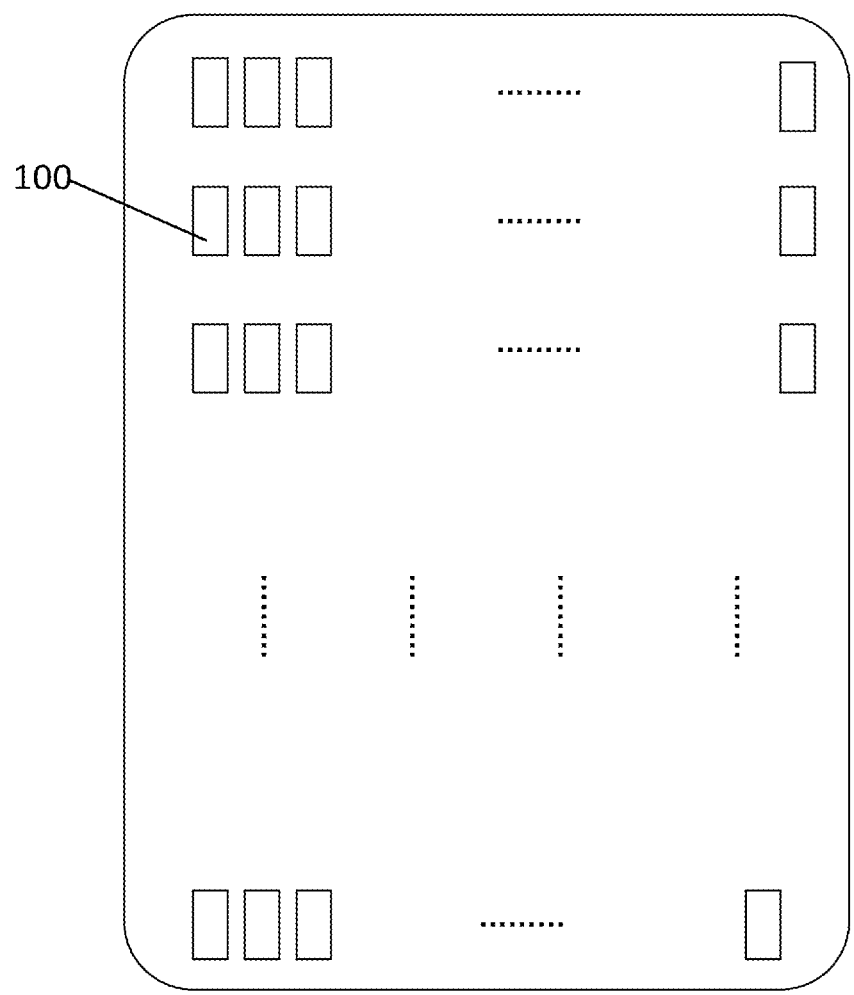
FIG. 1 is a schematic structural diagram of an exemplary display substrate.
Figure 2:
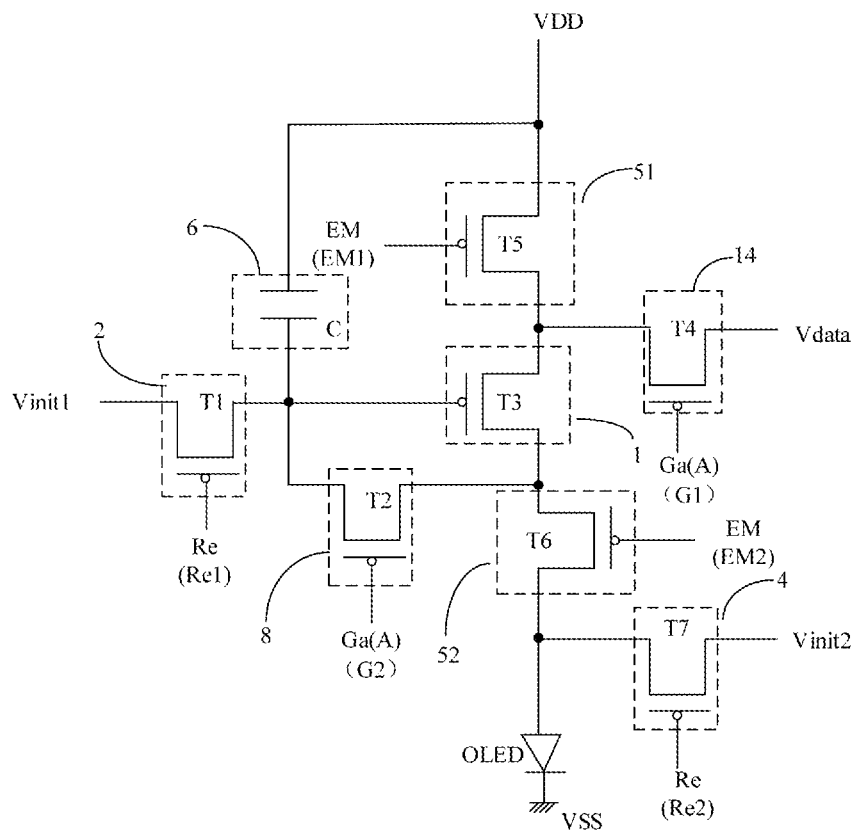
FIG. 2 is a schematic diagram of an exemplary pixel driving circuit.

FIG. 1 is a schematic structural diagram of an exemplary display substrate; FIG. 2 is a schematic diagram of an exemplary pixel driving circuit; as shown in FIGS. 1 and 2, the display substrate includes a plurality of pixel units arranged in an array, and each pixel unit 100 includes a pixel driving circuit and a light emitting device OLED therein. The pixel driving circuit in each pixel unit 100 may include: a first reset sub-circuit 2, a threshold compensation sub-circuit 81, a driving sub-circuit 1, a data writing sub-circuit 7, a first light emission control sub-circuit 51, a second light emission control sub-circuit 52, a second reset sub-circuit 4, and a storage sub-circuit 6.

The first reset sub-circuit 2 is electrically connected to a control terminal of the driving sub-circuit 1 and is configured to reset the control terminal of the driving sub-circuit 1 under control of a first reset signal. The threshold compensation sub-circuit 8 is electrically connected to the control terminal and a second terminal of the driving sub-circuit 1, respectively, and is configured to compensate a threshold voltage of the driving sub-circuit 1. The data writing sub-circuit 7 is electrically connected to a first terminal of the driving sub-circuit 1 and is configured to write a data signal into the storage sub-circuit under control of a scan signal. The storage sub-circuit 6 is electrically connected to the control terminal of the driving sub-circuit 1 and a first power terminal VDD, respectively, and is configured to store the data signal. The first light emission control sub-circuit 51 is connected to the first power terminal VDD and the first terminal of the driving sub-circuit 1, respectively, and is configured to electrically connect/disconnect the driving sub-circuit 1 with/from the first power terminal VDD, and the second light emission control sub-circuit 52 is electrically connected to the second terminal of the driving sub-circuit 1 and a first electrode of a light emitting device OLED, respectively, and is configured to electrically connect/disconnect the driving sub-circuit 1 with/from the light emitting device OLED. The second reset sub-circuit 4 is electrically connected to the first electrode of the light emitting device OLED and is configured to reset the first electrode of the light emitting device OLED under control of a second reset control signal.

With continued reference to FIG. 2, the first reset sub-circuit includes a first transistor T1, the threshold compensation sub-circuit 8 includes a second transistor T2, the driving sub-circuit 1 includes a third transistor T3, the control terminal of the driving sub-circuit 1 includes a control electrode of the third transistor T3, the first terminal of the driving sub-circuit 1 includes a first electrode of the third transistor T3, and the second terminal of the driving sub-circuit 1 includes a second electrode of the third transistor T3. The data writing sub-circuit 7 includes a fourth transistor T4, the storage sub-circuit 6 includes a storage capacitor C, the first light emission control sub-circuit 51 includes a fifth transistor T5, the second light emission control sub-circuit 52 includes a sixth transistor T6, and the second reset sub-circuit 4 includes a seventh transistor T7.

It should be noted that, according to the characteristics of the transistors, the transistors may be divided into N-type transistors and P-type transistors, and for the sake of clarity, the solutions of the present disclosure are described in detail by taking the transistors in the pixel driving circuit in FIG. 2 being P-type transistors (for example, P-type MOS transistors) as an example, that is, in the description of the present disclosure, the third transistor T3, the fourth transistor T4, the second transistor T2, the fifth transistor T5, the sixth transistor T6, the first transistor T1, the seventh transistor T7, and the like may all be P-type transistors. However, the transistors in the embodiments of the present disclosure are not limited to P-type transistors, and one skilled in the art may also implement the functions of one or more transistors in the embodiments of the present disclosure by using N-type transistors (e.g., N-type MOS transistors) as desired.

In addition, the transistors used in the embodiments of the present disclosure may be thin film transistors or field effect transistors or other switching devices having the same characteristics, and the thin film transistors may include oxide semiconductor thin film transistors, amorphous silicon thin film transistors or polysilicon thin film transistors, and the like. Each transistor includes a first electrode, a second electrode and a control electrode; the control electrode is used as a gate of the transistor, one of the first electrode and the second electrode serves as a source of the transistor, and the other one of the first electrode and the second electrode serves as a drain of the transistor; the source and the drain of the transistor may be symmetrical in structure, so that there may be no difference in physical structure therebetween. In the embodiments of the present disclosure, in order to distinguish, except for the gate serving as the control electrode, the first electrode is directly described as the source, and the second electrode is directly described as the drain, so that the source and the drain of each of all or part of the transistors in the embodiments of the present disclosure may be interchanged as desired.

With continued reference to FIG. 2, a drain of the fourth transistor T4 is electrically connected to a source of the third transistor T3, a source of the fourth transistor T4 is configured to be electrically connected to a data line Data to receive the data signal, and a gate of the fourth transistor T4 is configured to be electrically connected to a first scan signal line G1 to receive the scan signal; a second terminal of the storage capacitor C is electrically connected with the first power terminal VDD, and a first terminal of the storage capacitor C is electrically connected with a gate of the third transistor T3; a source of the second transistor T2 is electrically connected to the gate of the third transistor T3, a drain of the second transistor T2 is electrically connected to a drain of the third transistor T3, and a gate of the second transistor T2 is configured to be electrically connected to a second scan signal line G2 to receive a compensation control signal; a source of the first transistor T1 is configured to be electrically connected to a first initialization signal terminal Vinit1 to receive a first reset signal, a drain of the first transistor T1 is electrically connected to the gate of the third transistor T3, and a gate of the first transistor T1 is configured to be electrically connected to a first reset signal terminal Re1 to receive a first reset control signal; a drain of the seventh transistor T7 is configured to be electrically connected to a second initialization signal terminal Vinit1 to receive a second reset signal, a source of the seventh transistor T7 is electrically connected to the first electrode of the light emitting device OLED, and a gate of the seventh transistor T7 is configured to be electrically connected to a second reset signal terminal Re2 to receive a second reset control signal; a source of the fifth transistor T5 is electrically connected to the first power terminal VDD, a drain of the fifth transistor T5 is electrically connected to the source of the third transistor T3, and a gate of the fifth transistor T5 is configured to be electrically connected to a first enable signal terminal EM1 to receive a first light emission control signal; a source of the sixth transistor T6 is electrically connected to the drain of the third transistor T3, a drain of the sixth transistor T6 is electrically connected to the first electrode of the light emitting device OLED, and a gate of the sixth transistor T6 is configured to be electrically connected to a second enable signal terminal EM2 to receive a second light emission control signal; a second electrode of the light emitting device OLED is electrically connected to a second power terminal VSS.

For example, one of the first power terminal VDD and the second power terminal VSS is a high voltage terminal, and the other of the first power terminal VDD and the second power terminal VSS is a low voltage terminal. For example, as shown in FIG. 2, the first power terminal VDD is a voltage source to output a first voltage, which is a constant positive voltage; and the second power terminal VSS may be a voltage source to output a second voltage, which is a constant negative voltage, or the like. For example, in some examples, the second power supply terminal VSS may be grounded.

With continued reference to FIG. 2, the scan signal and the compensation control signal may be the same, that is, the gate of the fourth transistor T4 and the gate of the second transistor T2 may be electrically connected to a same signal line, for example, the first scan signal line G1, to receive the same signal (for example, the scan signal), and in this case, the display substrate may not be provided with the second scan signal line G2, thus reducing the number of signal lines. For another example, the gate of the fourth transistor T4 and the gate of the second transistor T2 may be electrically connected to different signal lines, respectively, that is, the gate of the fourth transistor T4 is electrically connected to the first scan signal line G1, the gate of the second transistor T2 is electrically connected to the second scan signal line G2, and the signals transmitted by the first scan signal line G1 and the second scan signal line G2 are the same.

It should be noted that the scan signal and the compensation control signal may not be the same, so that the gates of the fourth transistor T4 and the second transistor T2 may be separately controlled, thereby improving the flexibility of controlling the pixel circuit. In the embodiment of the present disclosure, a case where the gate of the fourth transistor T4 and the gate of the second transistor T2 are electrically connected to the first scan signal line Ga (A) is taken as an example for explanation.

With continued reference to FIG. 2, the first light emission control signal and the second light emission control signal may be the same, i.e., the gate of the fifth transistor T5 and the gate of the sixth transistor T6 may be electrically connected to a same signal line, e.g., the first enable signal terminal EM1, to receive a same signal (e.g., the first light emission control signal), and in this case, the display substrate may not be provided with the second enable signal terminal EM2, thus reducing the number of ports. For another example, the gate of the fifth transistor T5 and the gate of the sixth transistor T6 may also be electrically connected to different signal terminals, respectively, for example, the gate of the fifth transistor T5 is electrically connected to the first enable signal terminal EM1, and the gate of the sixth transistor T6 is electrically connected to the second enable signal terminal EM2, but the signals transmitted by the first enable signal terminal EM1 and the second enable signal terminal EM2 are the same.

It should be noted that, in a case where the fifth transistor T5 and the sixth transistor T6 are of different types, for example, the fifth transistor T5 is a P-type transistor, and the sixth transistor T6 is an N-type transistor, the first light emission control signal and the second light emission control signal may also be different, which is not limited in the embodiment of the present disclosure. In the embodiment of the present disclosure, a case where the gates of the fifth transistor T5 and the sixth transistor T6 are both connected to an enable signal terminal EM is taken as an example for explanation.

For example, the first reset control signal and the second reset control signal may be the same, that is, the gate of the first transistor T1 and the gate of the seventh transistor T7 may be electrically connected to a same signal line, for example, the first reset signal terminal Re t, to receive a same signal (for example, the first reset control signal), and in such case, the display substrate may not be provided with the second reset signal terminal Re2, thus reducing the number of signal lines. For another example, the gate of the first transistor T1 and the gate of the seventh transistor T7 may be electrically connected to different signal lines, respectively, that is, the gate of the first transistor T1 is electrically connected to the first reset signal terminal Re1, the gate of the seventh transistor T7 is electrically connected to the second reset signal terminal Re2, and the signals transmitted by the first reset signal terminal Re1 and the second reset signal terminal Re2 are the same. It should be noted that the first reset signal and the second reset signal may be different. In the embodiment of the present disclosure, a case where the gate of the first transistor T1 and the gate of the seventh transistor T7 are both electrically connected to a reset signal terminal Re is taken as an example for explanation.

For example, in some examples, the second reset control signal may be the same as the scan signal, i.e., the gate of the seventh transistor T7 may be electrically connected to the scan signal line Ga(A) to receive the scan signal as the second reset control signal.

For example, the source of the first transistor T1 and the drain of the seventh transistor T7 are connected to the first initialization signal terminal Vinit1 and the second initialization signal terminal Vinit2, respectively, and the first initialization signal terminal Vinit1 and the second initialization signal terminal Vinit2 may be DC reference voltage terminals for outputting a constant DC reference voltage. The first initialization signal terminal Vinit1 and the second initialization signal terminal Vinit2 may be the same, for example, the source of the first transistor T1 and the drain of the seventh transistor T7 are both connected to a same initialization signal terminal. The first initialization signal terminal Vinit1 and the second initialization signal terminal Vinit2 may be high voltage terminals or low voltage terminals, as long as they can provide the first reset signal and the second reset signal to reset the gate of the third transistor T3 and the first electrode of the light emitting element, which is not limited in the present disclosure. For example, the source of the first transistor T1 and the drain of the seventh transistor T7 may both be connected to a reset power signal line Vinit.

It should be noted that, in the embodiment of the present disclosure, a case where the gate of the first transistor T1 and the gate of the seventh transistor T7 are both electrically connected to the reset signal terminal Re, and the source of the first transistor T1 and the drain of the seventh transistor T7 are both electrically connected to the reset power signal line Vinit is taken as an example for explanation. In addition, the first reset sub-circuit 2, the threshold compensation sub-circuit 8, the driving sub-circuit 1, the data writing sub-circuit 7, the first light emission control sub-circuit 51, the second light emission control sub-circuit 52, the second reset sub-circuit 4, and the storage sub-circuit 6 in the pixel circuit shown in FIG. 2 are only schematic, and the specific structures of the sub-circuits such as the first reset sub-circuit 2, the threshold compensation sub-circuit 8, the driving sub-circuit 1, the data writing sub-circuit 7, the first light emission control sub-circuit 51, the second light emission control sub-circuit 52, the second reset sub-circuit 4, and the storage sub-circuit 6 may be configured as desired, which is not particularly limited in the embodiment of the present disclosure.

It should be noted that, in the embodiment of the present disclosure, in addition to the 7T1C (i.e., seven transistors and one capacitor) structure shown in FIG. 2, the pixel circuit of the sub-pixel may also be a circuit structure including another number of transistors and capacitors, such as a 7T12C structure, a 6T1C structure, a 6T12C structure, or a 9T12C structure, which is not limited in the embodiment of the present disclosure.

The light emitting device OLED in the embodiment of the present disclosure may be an Organic Light Emitting Diode (OLED). Certainly, the light emitting device OLED may also be a micro inorganic light emitting diode, and further, may be a current type light emitting diode, such as a Micro Light Emitting Diode (Micro LED) or a Mini Light Emitting Diode (Mini LED). One of the first electrode and the second electrode of the light emitting device OLED is an anode, and the other of the first electrode and the second electrode of the light emitting device OLED is a cathode; in the embodiment of the present invention, a case where the first electrode of the light emitting device OLED is the anode, and the second electrode of the light emitting device OLED is the cathode is taken as an example for explanation.

The inventors have found that a display abnormality is likely to occur when a leakage current exists in the fourth transistor in the pixel driving circuit, and have provided the following solutions for solving the problem.

Figure 3:
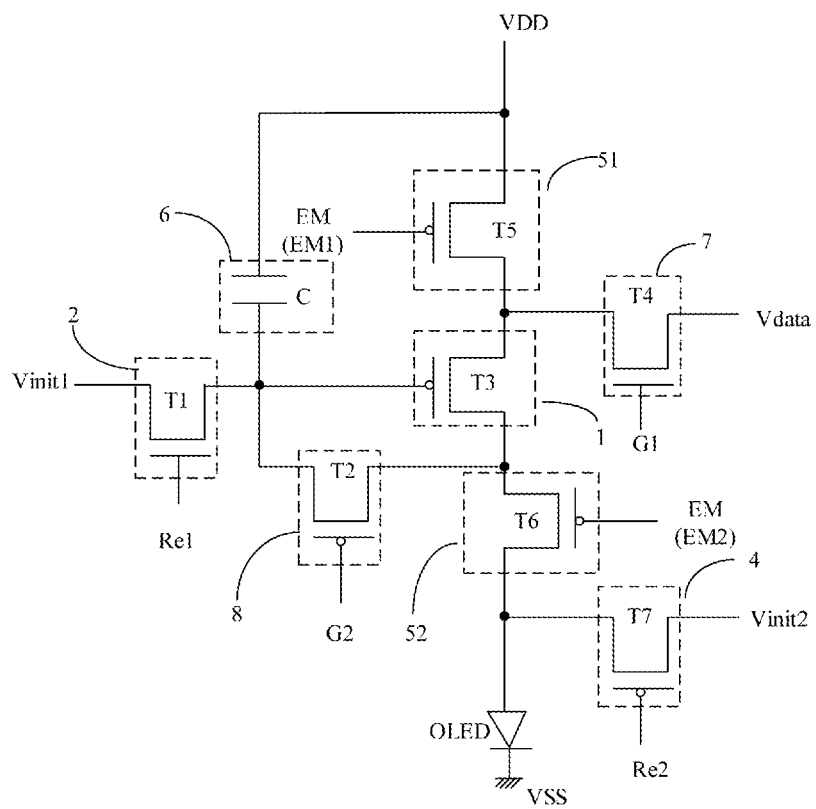
FIG. 3 is a schematic diagram of a pixel driving circuit according to an embodiment of the present disclosure.

In a first aspect, FIG. 3 is a schematic diagram of a pixel driving circuit according to an embodiment of the present disclosure; as shown in FIG. 3, the embodiment of the present disclosure provides a pixel driving circuit, which includes a data writing sub-circuit 7, a threshold compensation sub-circuit 8, a driving sub-circuit 1, and a storage sub-circuit 6. The data writing sub-circuit 7 is configured to transmit a data voltage signal to a first terminal of the driving sub-circuit 1 in response to a first scan signal. The threshold compensation sub-circuit 8 is configured to compensate a threshold voltage of the driving sub-circuit 1 in response to a second scan signal. The storage sub-circuit 6 is configured to store the data voltage signal. The driving sub-circuit 1 is configured to provide a driving current for a light emitting device OLED to be driven according to a voltage between the first terminal and a control terminal of the driving sub-circuit 1. Specifically, the data writing sub-circuit 7 in the embodiment of the present disclosure may include a fourth transistor T4, a source of the fourth transistor T4 is connected to a data line Data, a drain of the fourth transistor T4 is connected to the first terminal of the driving sub-circuit 1, and a gate of the fourth transistor T4 is connected to a first scan signal line G1. The fourth transistor T4 is an oxide thin film transistor. For example, the fourth transistor T4 is an N-type transistor, if a high level signal in written into the first scan signal line G1, the fourth transistor T4 is turned on, and the data voltage signal written by the data line Data is written into the first terminal of the driving sub-circuit 1.

In the embodiment of the present disclosure, since the data writing sub-circuit 7 includes the fourth transistor T4 and the fourth transistor T4 is an oxide thin film transistor, the problem of display abnormality caused by the voltage at the first terminal of the driving sub-circuit 1 being pulled up due to the leakage current of the fourth transistor T4 can be greatly alleviated. In some examples, with continued reference to FIG. 3, the pixel driving circuit of the embodiment of the present disclosure may include not only the above-described structures but also a first reset sub-circuit 2 and a second reset sub-circuit 4. The first reset sub-circuit 2 is configured to, in response to a first reset signal, reset the voltage at the control terminal of the driving sub-circuit 1 by a first initialization signal. The second reset sub-circuit 4 is configured to, in response to a second reset signal, reset a first electrode of the light emitting device OLED to be driven by a second initialization signal.

In some examples, a width W of a channel of the fourth transistor T4 ranges from 1.5 to 3.5, and may be, for example, 1.6, 1.8, 1.9, 2.0, 2.2, 2.5, 3.0, and the like; a length L of the channel ranges from 2.0 to 4.5, and may be, for example, 2.5, 2.7, 3.0, 3.2, 3.5, 4.0, and the like.

For example, the first reset sub-circuit 2 includes a first transistor T1; the second reset sub-circuit 4 includes a seventh transistor T7. A source of the first transistor T1 is connected to a first initialization signal terminal Vinit1, a drain of the first transistor T1 is connected to the control terminal of the driving sub-circuit 1, and a gate of the first transistor T1 is connected to a first reset signal terminal Re1. A source of the seventh transistor T7 is connected to the first electrode of the light emitting device OLED to be driven, a drain of the seventh transistor T7 is connected to a second initialization signal terminal Vinit2, and a gate of the seventh transistor T7 is connected to a second reset signal terminal Re2. In some examples, an absolute value of a reset voltage written by the first reset signal terminal Re1 may be greater than 1.5 times an absolute value of a threshold voltage of the driving sub-circuit 1 to ensure that the driving sub-circuit 1 can be biased quickly in a shorter time. For example, the absolute value of the reset voltage may be greater than 2 times, 2.5 times, or 3 times the absolute value of the threshold voltage of the driving sub-circuit 1, but is not limited thereto. The voltage written into the first initialization signal terminal Vinit1 ranges from −2V to −6V, for example, may be −2V, −3V, −4V, −5V, −6V, and the like, but is not limited thereto.

In some examples, the width W of the channel of the first transistor T1 ranges from 1.5 to 3.5, and may be, for example, 1.6, 1.8, 1.9, 2.0, 2.2, 2.5, 3.0 and the like; the length L of the channel ranges from 2.0 to 4.5, and may be, for example, 2.5, 2.7, 3.0, 3.2, 3.5, 4.0 and the like. The width W of the channel of the seventh transistor T7 ranges from 1.5 to 3.5, and may be, for example, 1.6, 1.8, 1.9, 2.0, 2.2, 2.5, 3.0, and the like; the length L of the channel ranges from 2.0 to 4.5, and may be, for example, 2.5, 2.7, 3.0, 3.2, 3.5, 4.0 and the like. In some examples, as shown in FIG. 3, the first transistor T1 may be an oxide thin film transistor, and in such case, the first transistor T1 may be an N-type thin film transistor, and the first transistor T1 may be formed during the fourth transistor T4 being formed. Moreover, the first transistor T1 being an oxide thin film transistor can effectively alleviate the problem that the leakage current of the first transistor T1 affects a potential of the control terminal of the driving sub-circuit 1. In the embodiment of the present disclosure, the seventh transistor T7 may be an N-type transistor or a P-type transistor, and a case where the seventh transistor T7 being a P-type transistor is taken as an example for description. Specifically, in an initialization stage, the first reset signal written to the first reset signal terminal Re1 is a high level signal, the second reset signal written to the second reset signal terminal Re2 is a low level signal, in such case, the first transistor T1 and the seventh transistor T7 are both turned on, a first initialization voltage written into the first initialization signal terminal resets the control terminal of the driving sub-circuit 1 through the first transistor T1, and a second initialization voltage written into the second initialization signal terminal Vinit2 resets an anode of the light emitting device OLED to be driven through the seventh transistor T7. In the embodiment of the present disclosure, the first transistor T1 and the seventh transistor T7 are respectively controlled by two reset signal terminals Re, and thus during a hold frame, the seventh transistor T7 is controlled to be turned on by the second reset signal terminal to reset the anode of the light emitting device OLED. The hold frame refers to a period between refreshing two frames of pictures. In such way, the brightness difference between the refresh frame and the hold frame can be effectively improved, and the probability of flicker of the display panel is reduced.

Figure 4:
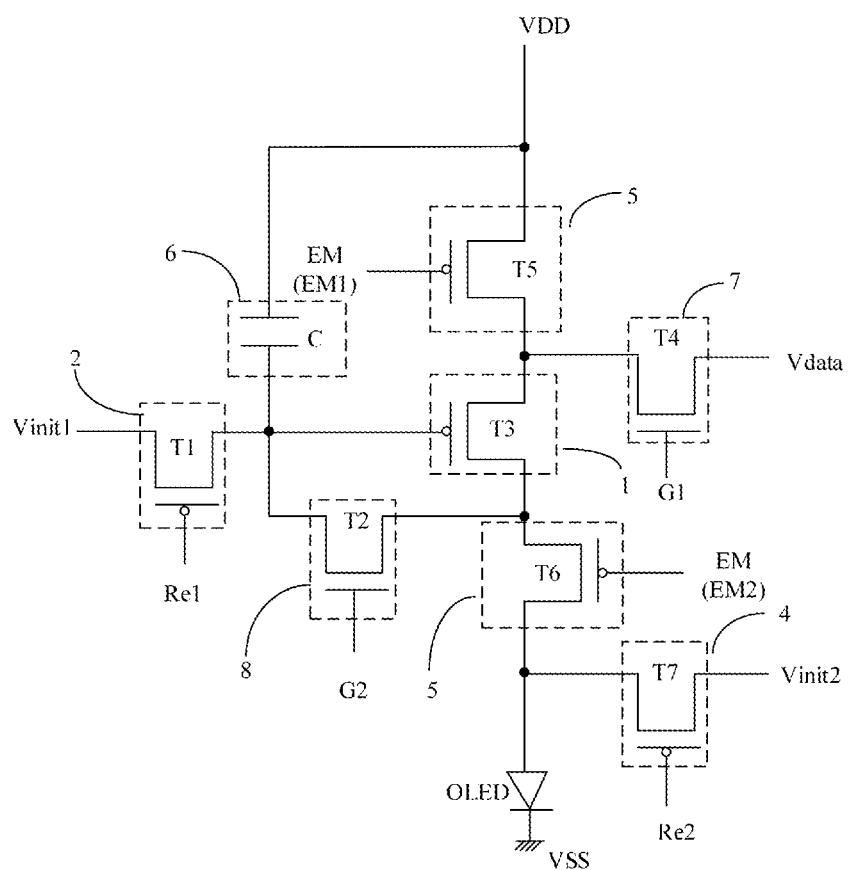
FIG. 4 is a schematic diagram of another pixel driving circuit according to an embodiment of the present disclosure.

FIG. 4 is a schematic diagram of another pixel driving circuit according to an embodiment of the present disclosure; as shown in FIG. 4, the first transistor T1 in the first reset sub-circuit 2 of the pixel driving circuit may also be a P-type transistor, i.e., has the same switching characteristic as the seventh transistor T7 in the second reset sub-circuit 4. In this case, the gates of the first transistor T1 and the seventh transistor T7 may be both connected to a same reset signal terminal Re, and the source of the first transistor T1 and the drain of the seventh transistor T7 may be connected to the same initialization signal terminal Vinit, that is, the first transistor T1 and the seventh transistor T7 are simultaneously operated, so that timing control is facilitated and wiring is simple.

In some examples, as shown in FIG. 3 or 4, the pixel driving circuit in the embodiment of the present disclosure includes not only the above-described structures but also a first emission control sub-circuit 51 and a second emission control sub-circuit 52. The first emission control sub-circuit 51 is configured to control whether the first voltage can be written into the first terminal of the driving sub-circuit 1 in response to a first emission control signal. The second light emission control sub-circuit 52 is configured to electrically connect/disconnect the driving sub-circuit 1 with/from the light emitting device OLED to be driven in response to a second light emission control signal.

For example, the first emission control sub-circuit 51 includes a fifth transistor T5; the second light emission control sub-circuit 52 includes a sixth transistor T6. A source of the fifth transistor T5 is connected to a first power terminal VDD, a drain of the fifth transistor T5 is connected to the first terminal of the driving sub-circuit 1, and a gate of the fifth transistor T5 is connected to a first enable signal terminal EM1. A source of the sixth transistor T6 is connected to the second terminal of the driving sub-circuit 1, a drain of the sixth transistor T6 is connected to the anode of the light emitting device OLED to be driven, and a gate of the sixth transistor T6 is connected to a second enable signal terminal EM2. In some examples, the fifth transistor T5 and the sixth transistor T6 may each employ a P-type transistor, but may also employ an N-type transistor. In the embodiment of the present disclosure, the fifth transistor T5 and the sixth transistor T6 are both P-type transistors. In addition, the fifth transistor T5 and the sixth transistor T6 may both be low temperature polysilicon thin film transistors, and certainly, may be also other types of thin film transistors, and in the embodiment of the present disclosure, a case where the fifth transistor T5 and the sixth transistor T6 are both low temperature polysilicon thin film transistors is taken as an example. In some examples, in a case where the switching characteristics of the fifth transistor T5 and the sixth transistor T6 are the same, the gate of the fifth transistor T5 and the gate of the sixth transistor T6 may be connected to a same enable signal terminal EM, which can effectively reduce the number of wires and contribute to an increase in the pixel aperture ratio of the display panel. In the following description, it is exemplified that the gate of the fifth transistor T5 and the gate of the sixth transistor T6 may be connected to the same enable signal terminal EM.

Specifically, in a light emitting stage, a light emission control signal written into the enable signal terminal EM is a low level signal, and in this case, the fifth transistor T5 and the sixth transistor T6 are simultaneously turned on, so that the driving sub-circuit 1 generates a driving current for driving the light emitting device OLED to emit light according to a voltage at the first power terminal VDD and a voltage at the gate of the driving sub-circuit 1.

In some examples, referring to FIG. 3 or 4, for the pixel driving circuit described above, the driving sub-circuit 1 may include a third transistor T3. A source of the third transistor T3 serves as a first terminal of the driving sub-circuit 1, a drain of the third transistor T3 serves as a second terminal of the driving sub-circuit 1, and a gate of the third transistor T3 serves as a control terminal of the driving sub-circuit 1. The source of the third transistor T3 is connected to the drain of the fourth transistor T4, the drain of the third transistor T3 is connected to the anode of the light emitting device OLED to be driven, and the gate of the third transistor T3 is connected to the storage sub-circuit 6. In this case, in the light emitting stage, the third transistor T3 may generate the driving current according to the voltages of the source and the gate thereof to drive the light emitting device OLED to emit light. In some examples, a threshold voltage Vth of the third transistor T3 may range from −2V to −5V, and in some implementations, the threshold voltage Vth may be greater than or equal to −4V and less than or equal to −2.5V, and may be, for example, −4V, −3.5V, −3V, or −2.5V, but is not limited thereto.

Figure 5:
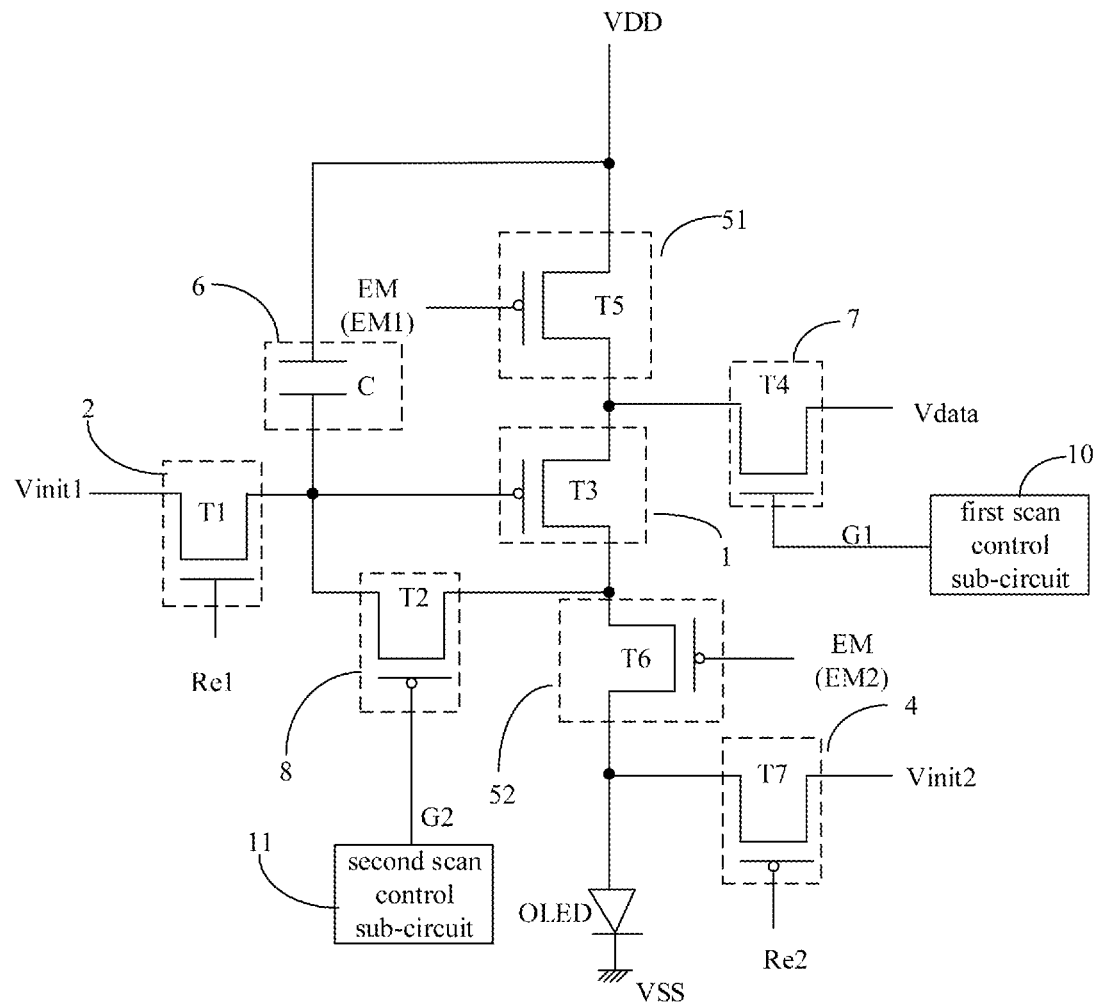
FIG. 5 is a schematic diagram of another pixel driving circuit according to an embodiment of the present disclosure.

In some examples, referring to FIG. 3 or 5, for the pixel driving circuit described above, the threshold compensation sub-circuit 8 may include a second transistor T2. A source of the second transistor T2 is connected to the control terminal of the driving sub-circuit 1, a drain of the second transistor T2 is connected to the second terminal of the driving sub-circuit 1, and a gate of the second transistor T2 is connected to a second scan signal line G2. The second transistor T2 may be a P-type transistor or an N-type transistor. In FIG. 3, the second transistor T2 is exemplified as a P-type transistor. In this case, in a data writing and threshold compensation stage, the second scan signal written into the second scan signal line G2 is a low level signal, in such case, the second transistor T2 is turned on, so as to short-circuit the control terminal and the second terminal of the driving sub-circuit 1 to perform threshold compensation on the control terminal of the driving sub-circuit 1. In FIG. 4, the second transistor T2 is an oxide thin film transistor, and the second transistor T2 is an N-type transistor, so that the risk of leakage current of the second transistor T2 can be effectively reduced, thereby preventing the voltage at the control terminal of the driving sub-circuit 1 from being affected by the leakage current of the second transistor T2.

In some examples, the storage sub-circuit 6 may include a storage capacitor C having a first terminal connected to the control terminal of the driving sub-circuit 1 and a second terminal connected to the first power terminal VDD. The storage capacitor C is mainly configured to store the data voltage written by the data line Data in the data writing and threshold compensation stage.

In some examples, FIG. 5 is a schematic diagram of another pixel driving circuit of an embodiment of the present disclosure; as shown in FIG. 5, the pixel driving circuit includes not only the above-described structures but also a first scan control sub-circuit 10 and a second scan control sub-circuit 11. The first scan control sub-circuit 10 is configured to provide the first scan signal to the fourth transistor T4 during the data writing and threshold compensation stage. The second scan control sub-circuit 11 is configured to provide the second scan signal to the threshold compensation sub-circuit 8 in the data writing and threshold compensation stage. A start timing of the first scan signal is earlier than a start timing of the second scan signal; and an ending timing of the first scan signal is the same as an ending timing of the second scan signal. For example, a duration of the first scan signal is 1.2-2.0 times that of the second scan signal. In this case, it can be ensured that the data voltage can be written sufficiently in the data voltage writing and threshold compensation stage. The first scan control sub-circuit 10 and the second scan control sub-circuit 11 may be specifically shift registers.

The pixel driving circuit in the embodiment of the present disclosure is described below with reference to a specific example.

In an example, as shown in FIG. 5, the pixel driving circuit includes a data writing sub-circuit 7, a threshold compensation sub-circuit 8, a driving sub-circuit 1, a storage sub-circuit 6, a first light emission control sub-circuit 51, a second light emission control sub-circuit 52, a first reset sub-circuit 2 and a second reset sub-circuit 4. The data writing sub-circuit 7 includes a fourth transistor T4, the driving sub-circuit 1 includes a third transistor T3, the threshold compensation sub-circuit 8 includes a second transistor T2, the first reset sub-circuit 2 includes a first transistor T1, the first light emission control sub-circuit 51 includes a fifth transistor T5, the second light emission control sub-circuit 52 includes a sixth transistor T6, and the second reset sub-circuit 4 includes a seventh transistor T7. Specifically, a source of the fourth transistor T4 is connected to a data line Data, a drain of the fourth transistor T4 is connected to a first terminal of the driving sub-circuit 1, a gate of the fourth transistor T4 is connected to a first scan signal line G1, with the first scan signal line G1 being connected to the first scan control sub-circuit. A source of the second transistor T2 is connected to a gate of the third transistor T3 and a first terminal of the storage capacitor, a drain of the second transistor T2 is connected to a drain of the third transistor T3 and a source of the sixth transistor T6, a gate of the second transistor T2 is connected to a second scan signal line G2, with the second scan signal line G2 being connected to the second scan control sub-circuit. A source of the first transistor T1 is connected to a first initialization signal terminal Vinit1, a drain of the first transistor T1 is connected to the gate of the third transistor T3, and a gate of the first transistor T1 is connected to a first reset signal terminal Re1. A source of the fifth transistor T5 is connected to a first power terminal VDD, a drain of the fifth transistor T5 is connected to the source of the third transistor T3, and a gate of the fifth transistor T5 is connected to a first enable signal terminal EM1. A source of the sixth transistor T6 is connected to the second terminal of the driving sub-circuit 1, a drain of the sixth transistor T6 is connected to a first electrode (an anode) of the light emitting device OLED to be driven, and a gate of the sixth transistor T6 is connected to a second enable signal terminal EM2. A source of the seventh transistor T7 is connected to the first electrode of the light emitting device OLED to be driven, a drain of the seventh transistor T7 is connected to a second initialization signal terminal Vinit2, and a gate of the seventh transistor T7 is connected to a second reset signal terminal Re2.

With continued reference to FIG. 5, both the first transistor T1 and the fourth transistor T4 in the pixel driving circuit are oxide thin film transistors and are N-type transistors. The third transistor T3, the second transistor T2, the fifth transistor T5, the sixth transistor T6, and the seventh transistor T7 are low-temperature polysilicon transistors and are P-type transistors.

Figure 6:
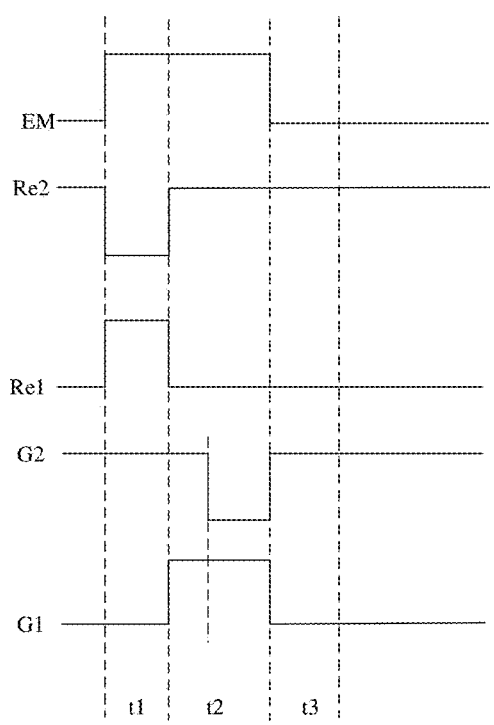
FIG. 6 is a timing diagram illustrating an operation of the pixel driving circuit shown in FIG. 5.

FIG. 6 is a timing diagram illustrating an operation of the pixel driving circuit shown in FIG. 5; the operation of the pixel driving circuit shown in FIG. 5 will be described with reference to the timing diagram of FIG. 6.

In an initialization stage (t1), the first reset signal written into the first reset signal terminal Re1 is a high level signal, and the second reset signal written into the second reset signal terminal Re2 is a low level signal, and in this case, the first transistor T1 and the seventh transistor T7 are turned on. The first initialization voltage written into the first initialization signal terminal Vinit1 resets the voltage at the gate of the third transistor T3 through the first transistor T1. The second initialization voltage written into the second initialization signal terminal Vinit2 resets the anode of the light emitting device OLED to be driven through the seventh transistor T7. The anode of the light-emitting device OLED is written with the second initialization voltage (Vinit2≤VSS, VSS representing a voltage of a second power terminal VSS connected to the cathode of the light-emitting device OLED) through the seventh transistor T7, so that the light emitting device OLED is no longer in a forward conduction state, an internal electric field formed by directional movement of impurity ions in the light emitting device OLED gradually disappears, and the characteristics of the light emitting device OLED are recovered.

In a data writing and threshold compensation stage (t2), first, the first scan signal written by the first scan control sub-circuit 10 into the first scan signal line G1 is a high level signal, and in response to that a preset time lapses after the first scan signal is written by the first scan signal line G1, the second scan control sub-circuit 11 writes the second scan signal being a low level signal into the second scan signal line G2. That is to say, the start timing of the first scan signal is earlier than the start timing of the second scan signal. The fourth transistor T4 is turned on first, the data voltage written by the data line Data is written into the source of the third transistor T3, the second transistor T2 is turned on in response to that a preset time lapses after the fourth transistor T4 is turned on, so that the gate and the drain of the third transistor T3 are short-circuited, and the threshold voltage is written into the gate of the third transistor T3 until the third transistor T3 is turned off. The voltage at the gate of the thrird transistor T3 is equal to Vdata+Vth (Vth<0, and Vth being a threshold voltage of the third transistor T3), and is stored in the storage capacitor C. The voltages of the first terminal and the second terminal of the storage capacitor C are Vdata+Vth and VDD, respectively. In this stage, since the duration in which the fourth transistor T4 is written is relatively long, the data voltage on the data line Data can be sufficiently written into the source of the third transistor T3.

In a light emission stage (t3), a low level signal is written into the enable signal terminal EM, the fifth transistor T5 and the sixth transistor T6 are both turned on, the source of the third transistor T3 is connected to the first power terminal VDD, and a voltage at the source of the third transistor T3 is instantaneously changed to VDD from Vdata in the previous stage. The light emitting device OLED is driven by the third transistor T3 to emit light, and in this case, the third transistor T3 operates in a saturation region, the voltage at the gate of the third transistor T3 is equal to Vdata+Vth, and the voltage at the source of the third transistor T3 is equal to VDD, so that a gate-source voltage vgs of the third transistor T3 is equal to (Vdata+Vth)−VDD, that is, vgs=(Vdata+Vth)−VDD, until the reset stage of the next frame is reached.

A light emission current of the light emitting device OLED is equal to a current flowing through the third transistor T3, which is expressed as follows:

$$\begin{aligned} I_D &= \beta \, (\text{V}gs - \text{V}th)^2 \\ &= \beta \, (\text{V}data + \text{V}th - \text{V}DD - \text{V}th)^2 \\ &= \beta \, (\text{V}data - \text{V}DD)^2 \end{aligned}$$

where, $$\beta = \frac{1}{2}\mu_n C_{OX}\left(\frac{W}{L}\right),$$

$\mu_n$ is an electron mobility of the third transistor T3, $C_{ox}$ is an insulation capacitance per unit area, and W/L is a width-to-length ratio of the third transistor T3.

In another example, as shown in FIG. 4, the pixel driving circuit has substantially the same structure as the pixel driving circuit shown in FIG. 3, except that in the pixel driving circuit shown in FIG. 4, the first transistor T1 is a low temperature polysilicon thin film transistor and is a P-type transistor. That is to say, the first transistor T1 and the seventh transistor T7 in the second reset sub-circuit 4 have the same switching characteristics. In this case, the gates of the first transistor T1 and the seventh transistor T7 may be both connected to the same reset signal terminal Re, and the source of the first transistor T1 and the drain of the seventh transistor T7 may be both connected to the same initialization signal terminal Vinit, that is, the first transistor T1 and the seventh transistor T7 are simultaneously operated, so that timing control is facilitated and wiring is simple.

The operations of the pixel driving circuit in FIG. 4 and the pixel driving circuit in FIG. 3 are different only in the initialization stage, and the rest stages thereof are the same, and thus only the initialization stage of the pixel driving circuit in FIG. 4 will be described below.

In the initialization stage, the reset signal terminal Re is written with a high level signal, the first transistor T1 and the seventh transistor T7 are both turned on, and in this case, the gate of the third transistor T3 and the anode of the light emitting device OLED to be driven may be reset by the initialization voltage at the initialization signal terminal Vinit.

Figure 7:
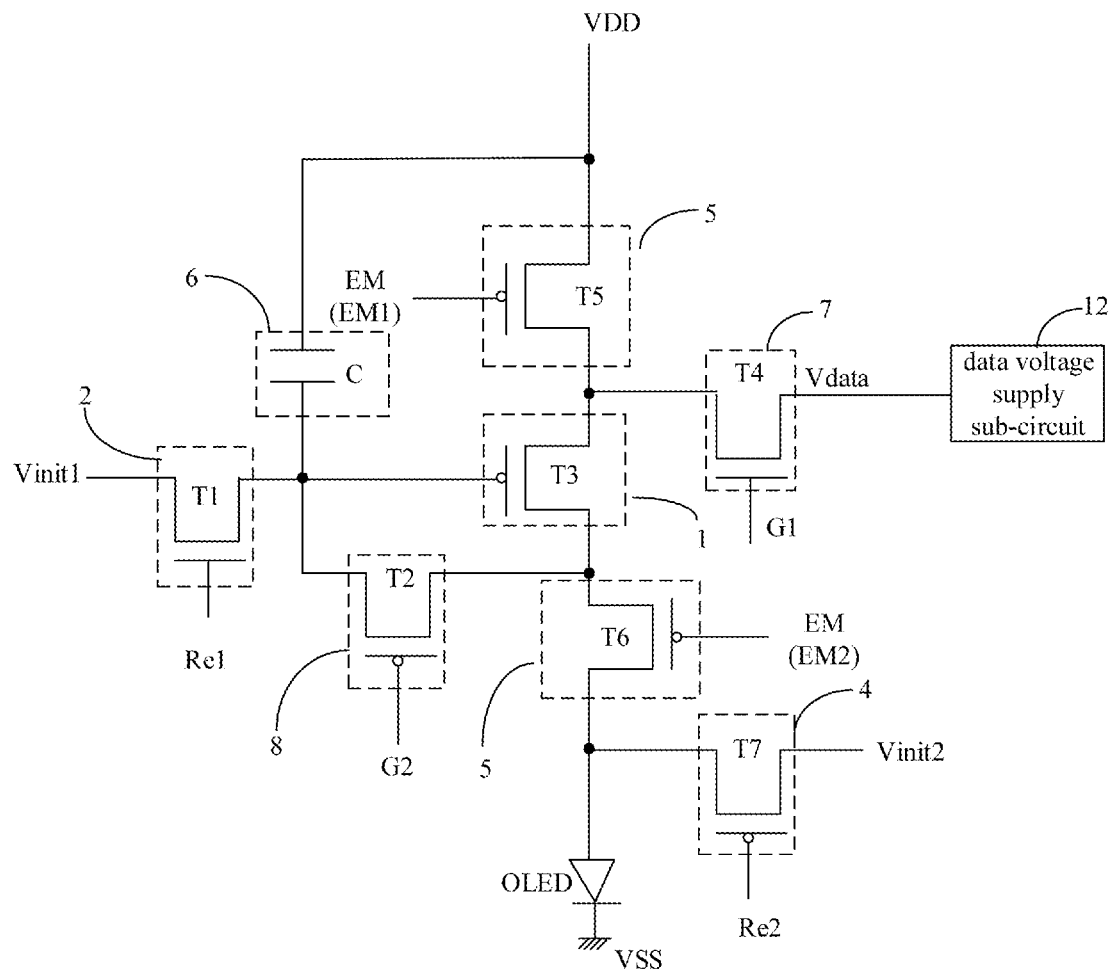
FIG. 7 is a schematic diagram of another pixel driving circuit according to an embodiment of the present disclosure.

In another example, FIG. 7 is a schematic diagram of another pixel driving circuit of an embodiment of the present disclosure; as shown in FIG. 7, the pixel driving circuit may have substantially the same structure as the pixel driving circuit shown in FIG. 3, except that the pixel driving circuit further includes a data voltage supply sub-circuit 12 connected to the source of the fourth transistor T4 through the data line Data. The data voltage supply sub-circuit 12 is configured to write a first voltage into the data line Data in the initialization stage, so that the data writing sub-circuit 7 transmits the first voltage to the first terminal of the driving sub-circuit 1; the first voltage is greater than or equal to a data voltage corresponding to a maximum brightness value that can be displayed by the light emitting device OLED; alternatively, the first voltage is less than or equal to a data voltage corresponding to a minimum luminance value that can be displayed by the light emitting device OLED. That is, writing a larger voltage into the source of the third transistor T3 in the initialization stage can eliminate the shift of the threshold voltage of the third transistor T3 caused by hysteresis. Alternatively, writing a smaller voltage into the source of the third transistor T3 in the initialization stage can also eliminate the shift of the threshold voltage of the third transistor T3 caused by hysteresis.

Figure 8:
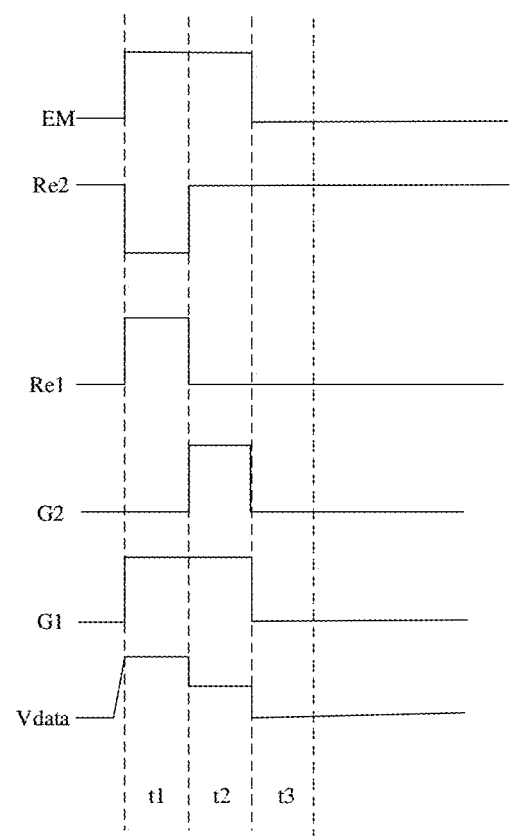
FIG. 8 is a timing diagram illustrating an operation of the pixel driving circuit shown in FIG. 7.

FIG. 8 is a timing diagram illustrating an operation of the pixel driving circuit shown in FIG. 7; the operation of the pixel driving circuit shown in FIG. 7 will be described below with reference to FIG. 8.

In an initialization phase (Tt1), the first reset signal written into the first reset signal terminal Re1 is a high level signal, the second reset signal written into the second reset signal terminal Re2 is a low level signal, the first scan signal written into the first scan signal line is a high level signal, and in this case, the fourth transistor T4, the first transistor T1 and the seventh transistor T7 are all turned on. The first initialization voltage written into the first initialization signal terminal Vinit1 resets the voltage at the gate of the third transistor T3 through the first transistor T1. The second initialization voltage written into the second initialization signal terminal Vinit2 resets the anode of the light emitting device OLED to be driven through the seventh transistor T7. The anode of the light emitting device OLED is written with a second initialization voltage Vinit2 (Vinit2≤VSS) through the seventh transistor T7, so that the light emitting device OLED is no longer in a forward conduction state, and an internal electric field formed by directional movement of impurity ions in the light emitting device OLED gradually disappears, thereby recovering the characteristics of the light emitting device OLED. Meanwhile, the data voltage written into the data line Data by the data voltage supply sub-circuit 12 is the first voltage Vdata1, and in this case, the first voltage Vdata1 is written into the source of the third transistor T3 through the fourth transistor T4.

In a data writing and threshold compensation stage (t2), the first scan signal written into the first scan signal line G1 is kept at a high level signal, and a low level signal is written into the second scan signal line G2. The fourth transistor T4 is kept to be turned on, a data voltage (a second voltage Vdata) written into the data line Data is written into the source of the third transistor T3, the second transistor T2 is turned on in response to a preset time lapses after the fourth transistor T4 is turned on, so that the gate and the drain of the third transistor T3 are short-circuited, and a threshold voltage is written into the gate of the third transistor T3 until the third transistor T3 is turned off. The voltage at the gate of the driving transistor T3 is equal to Vdata+Vth (Vth<0, Vth being the threshold voltage of the driving transistor T3), and is stored in the storage capacitor C. The voltages of the first terminal and the second terminal of the storage capacitor C are equal to Vdata+Vth and VDD, respectively.

In a light emission stage (t3), the enable signal terminal EM is written with a low level signal, and the fifth transistor T5 and the sixth transistor T6 are both turned on, the source of the third transistor T3 is connected to the first power terminal VDD, and the voltage at the source of the third transistor T3 is instantaneously changed to VDD from Vdata in the previous stage. The light emitting device OLED is driven by the third transistor T3 to emit light, and in this case, the third transistor T3 operates in a saturation region, the voltage at the gate of the third transistor T3 is equal to Vdata+Vth, and the voltage at the source of the third transistor T3 is equal to VDD, so that the gate-source voltage vgs of the third transistor T3 is equal to (Vdata+Vth)−VDD, that is, vgs=(Vdata+Vth)−VDD, until the reset stage of the next frame is reached.

The light emission current of the light emitting device OLED is equal to the current flowing through the third transistor T3, which is expressed as follows:

$$\begin{aligned} I_D &= \beta \ (\text{V}gs - \text{V}th)^2 \\ &= \beta \ (\text{V}data + \text{V}th - \text{V}DD - \text{V}th)^2 \\ &= \beta \ (\text{V}data - \text{V}DD)^2 \end{aligned}$$

where, $$\beta = \frac{1}{2}\mu_n C_{OX}\left(\frac{W}{L}\right),$$

$\mu_n$ is an electron mobility of the third transistor T3, $C_{ox}$ is an insulation capacitance per unit area, and L is a width-to-length ratio of the third transistor T3.

Figure 9:
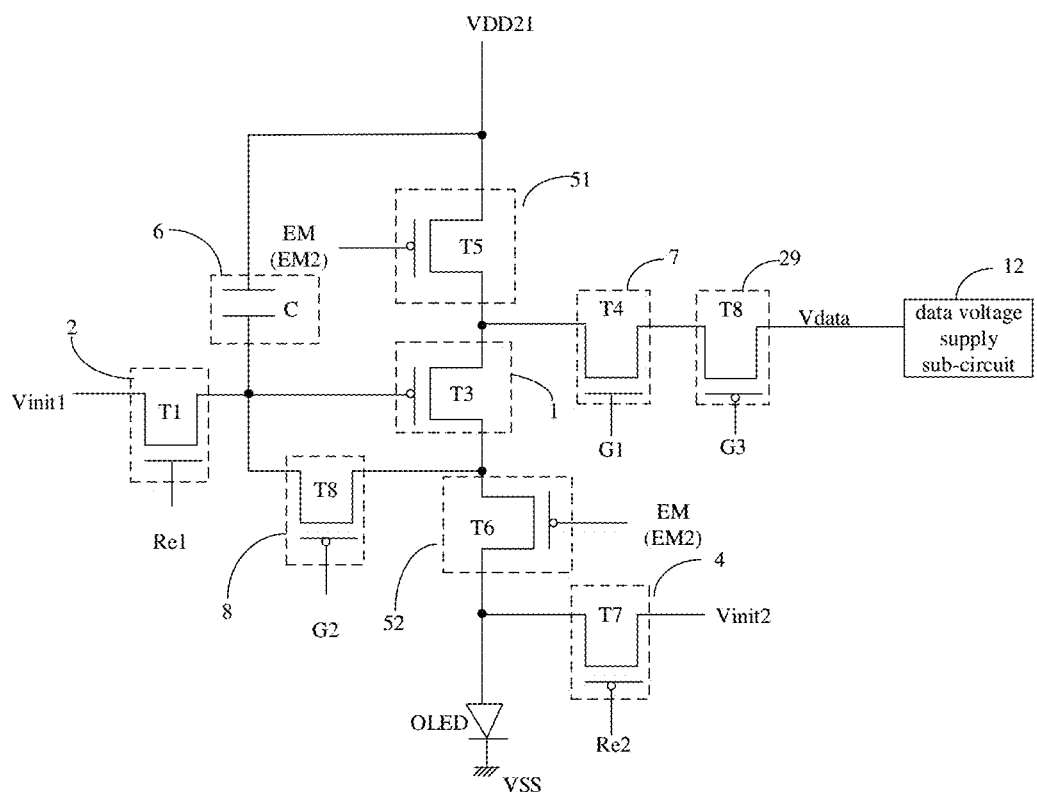
FIG. 9 is a schematic diagram of another pixel driving circuit according to an embodiment of the present disclosure.

In another example, FIG. 9 is a schematic diagram of another pixel driving circuit of an embodiment of the present disclosure; as shown in FIG. 9, the pixel driving circuit in FIG. 9 has substantially the same structure as the pixel driving circuit shown in FIG. 7, except that the pixel driving circuit further includes an auxiliary sub-circuit 29, and the auxiliary sub-circuit 29 is configured to reduce a leakage current of the fourth transistor T4 under the control of a third scan signal. For example, the auxiliary sub-circuit 29 includes an eighth transistor T8, a source of the eighth transistor T8 is connected to the data line Data, a drain of the eighth transistor T8 is connected to the source of the fourth transistor T4, and a gate of the eighth transistor T8 is connected to a third scan signal line G3. In some examples, the switching characteristic of the eighth transistor T8 is opposite to that of the fourth transistor T4, i.e., the eighth transistor T8 is a P-type transistor. Specifically, in the initialization stage and the data writing and threshold compensation stage, a low level signal is written into the third scan signal line G3, a high level signal is written into the gate of the fourth transistor T4, and the fourth transistor T4 and the eighth transistor T8 are controlled to operate simultaneously.

Figure 10:
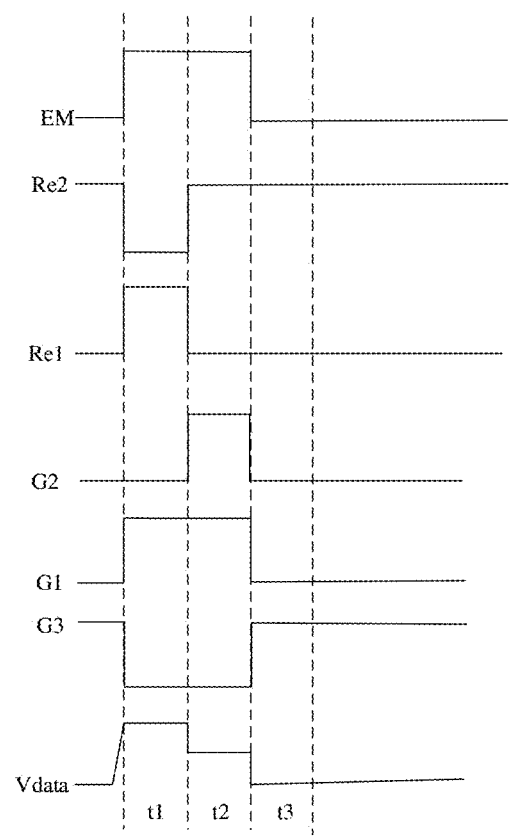
FIG. 10 is a timing diagram illustrating an operation of the pixel driving circuit shown in FIG. 9.

FIG. 10 is a timing diagram illustrating an operation of the pixel driving circuit shown in FIG. 9; the operation of the pixel driving circuit of FIG. 9 will be described in detail below with reference to the timing diagram of FIG. 10.

In an initialization stage (t1), the first reset signal written into the first reset signal terminal Re1 is a high level signal, the second reset signal written into the second reset signal terminal Re2 is a low level signal, the first scan signal written into the first scan signal line is a high level signal, the scan signal written into the third scan signal line is a low level signal, and in this case, the fourth transistor T4, the eighth transistor T8, the first transistor T1, and the seventh transistor T7 are all turned on. The first initialization voltage written into the first initialization signal terminal Vinit1 resets the voltage at the gate of the third transistor T3 through the first transistor T1. The second initialization voltage written into the second initialization signal terminal Vinit2 resets the anode of the light emitting device OLED to be driven through the seventh transistor T7. The anode of the light emitting device OLED is written with a second initialization voltage Vinit2 (Vinit2≤VSS) through the seventh transistor T7, so that the light emitting device OLED is no longer in a forward conduction state, and an internal electric field formed by directional movement of impurity ions in the light emitting device OLED gradually disappears, thereby recovering the characteristics of the light emitting device OLED. Meanwhile, the data voltage written into the data line Data by the data voltage supply sub-circuit 12 is a first voltage, and in this case, the first voltage is written into the source of the third transistor T3 through the fourth transistor T4 and the eighth transistor T8.

In a data writing and threshold compensation stage (t2), the first scan signal written into the first scan signal line G1 is kept at the high level signal, the second scan signal written into the second scan signal line G2 is kept at the low level signal, and the third scan signal written into the third scan signal line G is kept at the low level signal. The fourth transistor T4 and the eighth transistor T8 are kept to be turned on, a data voltage (a second voltage Vdata) written into the data line Data is written into the source of the third transistor T3, the second transistor T2 is turned on in response to that a preset time lapses after the fourth transistor T4 is turned on, so that the gate and the drain of the third transistor T3 are short-circuited, and a threshold voltage is written into the gate of the third transistor T3 until the third transistor T3 is turned off. The voltage at the gate of the driving transistor T3 is equal to Vdata+Vth (Vth<0, Vth being the threshold voltage of the third transistor T3), and is stored in the storage capacitor C. The voltages at the first terminal and the second terminal of the storage capacitor C are equal to Vdata+Vth and VDD respectively.

In a light emission stage (t3), the enable signal terminal EM is written with a low level signal, so that the fifth transistor T5 and the sixth transistor T6 are both turned on, the source of the third transistor T3 is connected to the first power terminal VDD, and the voltage at the source of the third transistor T3 is instantaneously changed to VDD from Vdata in the previous stage. The light emitting device OLED is driven by the third transistor T3 to emit light, and in this case, the third transistor T3 operates in a saturation region, the voltage at the gate of the third transistor T3 is equal to Vdata+Vth, and the voltage at the source of the third transistor T3 is equal to VDD, so a gate-source voltage vgs of the third transistor T3 is equal to (Vdata+Vth)−VDD, that is, vgs=(Vdata+Vth)−VDD, until the reset stage of the next frame is reached.

A light emission current of the light emitting device OLED is equal to the current flowing through the third transistor T3, which is expressed as follows:

$$\begin{aligned} I_D &= \beta \ (\text{V}gs - \text{V}th)^2 \\ &= \beta \ (\text{V}data + \text{V}th - \text{V}DD - \text{V}th)^2 \\ &= \beta \ (\text{V}data - \text{V}DD)^2 \end{aligned}$$

where, $$\beta = \frac{1}{2}\mu_n C_{OX}\left(\frac{W}{L}\right),$$

$\mu_n$ is an electron mobility of the third transistor T3, $C_{ox}$ is an insulation capacitance per unit area, and W/L is a width-to-length ratio of the third transistor T3.

In a second aspect, an embodiment of the present disclosure further provides a display panel, which includes the pixel driving circuit described above, so that the display panel has a better display effect.

The display panel may be a liquid crystal display device, an electroluminescent display device or any other product or component with a display function, such as an OLED panel, a Micro LED panel, a Mini LED panel, a mobile phone, a tablet computer, a television, a display, a notebook computer, a digital photo frame, a navigator.

It will be understood that the above embodiments are merely exemplary embodiments adopted to illustrate the principles of the present disclosure, and the present disclosure is not limited thereto. It will be apparent to those skilled in the art that various modifications and improvements may be made without departing from the spirit and scope of the present disclosure, and such modifications and improvements are considered to be within the scope of the present disclosure.

What is claimed is:

1. A pixel driving circuit, comprising: a data writing sub-circuit, a threshold compensation sub-circuit, a driving sub-circuit, a storage sub-circuit and a data voltage supply sub-circuit, wherein
    the data writing sub-circuit comprises a fourth transistor, a first electrode of the fourth transistor is connected with a data line, a second electrode of the fourth transistor is connected with a first terminal of the driving sub-circuit, and a control electrode of the fourth transistor is connected with a first scan signal line, and the fourth transistor is an oxide thin film transistor;
    the threshold compensation sub-circuit is configured to compensate a threshold voltage of the driving sub-circuit in response to a second scan signal;

the storage sub-circuit is configured to store a data voltage signal plus a threshold voltage of the driving sub-circuit;

the driving sub-circuit is configured to provide a driving current for a light emitting device to be driven according to voltages of the first terminal and a control terminal of the driving sub-circuit; and the data voltage supply sub-circuit is configured to write a first voltage into the data line in an initialization stage, so that the data writing sub-circuit transmits the first voltage to the first terminal of the driving sub-circuit; the first voltage is greater than or equal to a data voltage corresponding to a maximum brightness value that the light emitting device displays; or, the first voltage is greater than or equal to a data voltage corresponding to a minimum brightness value that the light emitting device displays.

2. The pixel driving circuit according to claim 1, further comprising: a first reset sub-circuit and a second reset sub-circuit, wherein the first reset sub-circuit is configured to reset, in response to a first reset signal, the voltage of the control terminal of the driving sub-circuit through a first initialization signal; and the second reset sub-circuit is configured to reset, in response to a second reset signal, the first electrode of the light emitting device to be driven through a second initialization signal.

3. The pixel driving circuit according to claim 2, wherein the first reset sub-circuit comprises a first transistor, and the second reset sub-circuit comprises a seventh transistor;

a first electrode of the first transistor is connected with a first initialization signal terminal, a second electrode of the first transistor is connected with the control terminal of the driving sub-circuit, and a control electrode of the first transistor is connected with a first reset signal terminal; and a first electrode of the seventh transistor is connected with the first electrode of the light emitting device to be driven, a second electrode of the seventh transistor is connected with a second initialization signal terminal, and a control electrode of the seventh transistor is connected with a second reset signal terminal.

4. The pixel driving circuit according to claim 3, wherein the first transistor is an oxide thin film transistor.

5. The pixel driving circuit according to claim 2, further comprising:

a first scan control sub-circuit and a second scan control sub-circuit, wherein the first scan control sub-circuit is configured to provide a first scan signal for the fourth transistor in a data writing and threshold compensation stage;

the second scan control sub-circuit is configured to provide the second scan signal to the threshold compensation sub-circuit in the data writing and threshold compensation stage; and a start timing of an enabled pulse of the first scan signal in the data writing and threshold compensation stage is earlier than a start timing of an enabled pulse of the second scan signal in the data writing and threshold compensation stage; an ending timing of the enabled pulse of the first scan signal in the data writing and threshold compensation stage is the same as an ending timing of the enabled pulse of the second scan signal in the data writing and threshold compensation stage.

6. The pixel driving circuit according to claim 2, wherein the driving sub-circuit comprises a third transistor, a first electrode of the third transistor is connected with the second electrode of the fourth transistor, a second electrode of the third transistor is connected with a second terminal of the threshold compensation sub-circuit, and a control electrode of the second driving transistor is connected with a first terminal of the threshold compensation sub-circuit.

7. The pixel driving circuit according to claim 2, wherein the threshold compensation sub-circuit comprises a second transistor;

a first electrode of the second transistor is connected with a control terminal of the driving sub-circuit, a second electrode of the second transistor is connected with a second terminal of the driving sub-circuit, and a control electrode of the second transistor is connected with a second scan signal line.

8. The pixel driving circuit according to claim 1, further comprising: a first light emission control sub-circuit and a second light emission control sub-circuit, wherein the first light emission control sub-circuit is configured to control, in response to a first light emission control signal, whether a first voltage is written into the first terminal of the driving sub-circuit;

the second light emission control sub-circuit is configured to electrically connect/disconnect, in response to a second light emission control signal, the driving sub-circuit with/from the light emitting device to be driven.

9. The pixel driving circuit according to claim 8, wherein the first emission control sub-circuit comprises a fifth transistor, and the second emission control sub-circuit comprises a sixth transistor, a first electrode of the fifth transistor is connected with a first power terminal, a second electrode of the fifth transistor is connected with the first terminal of the driving sub-circuit, and a control electrode of the fifth transistor is connected with a first enable signal terminal; and a first electrode of the sixth transistor is connected with a second terminal of the driving sub-circuit, a second electrode of the sixth transistor is connected with the first electrode of the light emitting device to be driven, and a control electrode of the sixth transistor is connected with a second enable signal terminal.

10. The pixel driving circuit according to claim 1, further comprising: an auxiliary sub-circuit, wherein the auxiliary sub-circuit is configured to reduce a leakage current of the fourth transistor under control of a third scan signal.

11. The pixel driving circuit according to claim 10, wherein the auxiliary sub-circuit comprises an eighth transistor, a first electrode of the eighth transistor is connected with the data line, a second electrode of the eighth transistor is connected with the first electrode of the fourth transistor, and a control electrode of the eighth transistor is connected with a third scan signal line.

12. The pixel driving circuit according to claim 1, further comprising:

a first scan control sub-circuit and a second scan control sub-circuit, wherein the first scan control sub-circuit is configured to provide a first scan signal for the fourth transistor in a data writing and threshold compensation stage;

the second scan control sub-circuit is configured to provide the second scan signal to the threshold compensation sub-circuit in the data writing and threshold compensation stage; and a start timing of an enabled pulse of the first scan signal in the data writing and threshold compensation stage is earlier than a start timing of an enabled pulse of the second scan signal in the data writing and threshold compensation stage; an ending timing of the enabled pulse of the first scan signal in the data writing and threshold compensation stage is the same as an ending timing of the enabled pulse of the second scan signal in the data writing and threshold compensation stage.

13. The pixel driving circuit according to claim 12, wherein a duration of the enabled pulse of the first scan signal in the data writing and threshold compensation stage is 1.2 to 2.0 times a duration of the enabled pulse of the second scan signal in the data writing and threshold compensation stage.

14. The pixel driving circuit according to claim 1, wherein the driving sub-circuit comprises a third transistor, a first electrode of the third transistor is connected with the second electrode of the fourth transistor, a second electrode of the third transistor is connected with a second terminal of the threshold compensation sub-circuit, and a control electrode of the third transistor is connected with a first terminal of the threshold compensation sub-circuit.

15. The pixel driving circuit according to claim 1, wherein the threshold compensation sub-circuit comprises a second transistor;

a first electrode of the second transistor is connected with a control terminal of the driving sub-circuit, a second electrode of the second transistor is connected with a second terminal of the driving sub-circuit, and a control electrode of the second transistor is connected with a second scan signal line.

16. The pixel driving circuit according to claim 15, wherein the second transistor is an oxide thin film transistor.

17. The pixel driving circuit according to claim 1, wherein the storage sub-circuit comprises a storage capacitor;

a first terminal of the storage capacitor is connected with a first power terminal, and a second terminal of the storage capacitor is connected with the control terminal of the driving sub-circuit.

18. A display panel, comprising the pixel driving circuit of claim 1.

* * * * *